(12) United States Patent
Huang et al.

(10) Patent No.: US 7,314,700 B2
(45) Date of Patent: Jan. 1, 2008

(54) HIGH SENSITIVITY RESIST COMPOSITIONS FOR ELECTRON-BASED LITHOGRAPHY

(75) Inventors: Wu-Song Huang, Poughkeepsie, NY (US); Wenjie Li, Poughkeepsie, NY (US); Wayne Moreau, Wappingers Falls, NY (US); David R. Medeiros, Ossining, NY (US); Karen E. Petrillo, Mahopac, NY (US); Robert N. Lang, Pleasant Valley, NY (US); Marie Angelopoulos, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 10/537,259

(22) PCT Filed: Dec. 5, 2002

(86) PCT No.: PCT/US02/39048

§ 371 (c)(1),
(2), (4) Date: May 31, 2005

(87) PCT Pub. No.: WO2004/053594

PCT Pub. Date: Jun. 24, 2004

(65) Prior Publication Data

US 2006/0127800 A1    Jun. 15, 2006

(51) Int. Cl.
G03C 1/492 (2006.01)
G03C 1/494 (2006.01)
G03C 1/76 (2006.01)
G03C 5/00 (2006.01)

(52) U.S. Cl. ............... 430/270.1; 430/322; 430/324; 430/325; 430/326; 430/330

(58) Field of Classification Search ............ 430/270.1, 430/322, 324, 325, 326, 330
See application file for complete search history.

(56) References Cited

U.S. PATENT DOCUMENTS

| | | | |
|---|---|---|---|
| 4,554,458 A | 11/1985 | Behringer et al. | |
| 4,996,136 A | 2/1991 | Houlihan | |
| 5,191,124 A | 3/1993 | Schwalm et al. | |
| 5,374,504 A | 12/1994 | Hanson et al. | |
| 5,384,229 A | 1/1995 | Pai et al. | |
| 5,403,695 A * | 4/1995 | Hayase et al. | 430/192 |
| 5,580,702 A * | 12/1996 | Hayase et al. | 430/326 |
| 5,679,497 A * | 10/1997 | Kimura | 430/296 |
| 5,866,913 A | 2/1999 | Robinson | |
| 5,880,169 A | 3/1999 | Osawa et al. | |
| 6,008,266 A | 12/1999 | Kuczynski et al. | |
| 6,037,097 A | 3/2000 | Bucchignano et al. | |
| 6,043,003 A | 3/2000 | Bucchignano et al. | |
| 6,069,684 A | 5/2000 | Golladay et al. | |
| 6,200,728 B1 | 3/2001 | Cameron et al. | |
| 6,274,289 B1 | 8/2001 | Subramanian et al. | |
| 6,280,911 B1 | 8/2001 | Trefonas, III | |
| 6,296,976 B1 | 10/2001 | Groves et al. | |
| 6,348,297 B1 | 2/2002 | Uetani et al. | |
| 6,355,383 B1 | 3/2002 | Yamashita | |
| 6,358,665 B1 | 3/2002 | Pawlowski et al. | |
| 6,406,830 B2 | 6/2002 | Inoue et al. | |
| 6,949,329 B2 * | 9/2005 | Endo et al. | 430/322 |

FOREIGN PATENT DOCUMENTS

| | | |
|---|---|---|
| JP | PUPA 06-043653 | 2/1994 |
| JP | PUPA 08-248626 | 9/1996 |
| JP | PUPA 09-160244 | 6/1997 |
| JP | PUPA 09-222724 | 8/1997 |
| JP | PUPA 09-323970 | 12/1997 |
| JP | PUPA 10-007650 | 1/1998 |
| JP | PUPA 2000-019732 | 1/2000 |
| JP | PUPA 2001-209181 | 8/2001 |

* cited by examiner

*Primary Examiner*—Geraldina Visconti
(74) *Attorney, Agent, or Firm*—Steven Capella

(57) ABSTRACT

The resist compositions having an acid sensitive imaging polymer and a radiation sensitive acid generator component comprising: (i) a first radiation sensitive acid generator selected from the group consisting of dissolution-inhibiting acid generators, and (ii) a second radiation sensitive acid generator selected from the group consisting of unprotected acidic group-functionalized acid generators and acid labile group-protected acidic group-functionalized radiation sensitive acid generators; enables formation of high sensitivity resists suitable for use in EPL, EUV, soft x-ray, and other low energy intensity lithographic imaging applications. The resist compositions may be useful in other lithographic processes as well.

14 Claims, No Drawings

HIGH SENSITIVITY RESIST COMPOSITIONS FOR ELECTRON-BASED LITHOGRAPHY

BACKGROUND OF THE INVENTION

In the field of semiconductor manufacturing, there is a continued quest for device size shrinkage. This course has led to demands for lithographic techniques to produce smaller feature sizes.

In lithographic processes using wave radiation (e.g., ultraviolet, deep ultraviolet (248 nm-KrF), far ultraviolet (193 nm-ArF), the smallest feature size that can be resolved is related to the wavelength of the imaging radiation. Real use of 193 nm lithographic processes is just starting in the microelectronics industry. Lithographic processes and tools using 157 nm radiation are envisioned, but are still years from commercial implementation. To some extent, feature size resolution with a given imaging radiation wavelength can be enhanced using alternative techniques such as bilayer lithographic processes and/or mask-related lithographic techniques (e.g., phase shift masks, etc.) Nevertheless, it is anticipated that further resolution enhancement capability (e.g., below 50 nm) will be needed for so-called next generation lithography or NGL. The likely routes for NGL are (a) so-called extreme ultraviolet (EUV) radiation lithography, (b) soft x-ray lithography, (c) electron projection lithography (EPL).

Electron beam imaging has been used in the microelectronics industry for many years in the manufacture of masks for conventional photolithography and for low volume/low throughput direct-write wafer applications. In these uses, a relatively high energy, narrow electron beam is directed precisely to selected areas of a resist layer on a mask blank or semiconductor wafer. Mask-making/direct-write processes are generally quite slow enabling accurate control of the beam position as it writes the desired pattern across the resist surface and sufficient energy transfer to the desired portions of the resist layer for subsequent development of the exposed pattern. Examples of resist materials highly suitable for use in these electron beam processes are disclosed in U.S. Pat. Nos. 6,043,003 and 6,037,097, the disclosures of which are incorporated herein by reference.

Electron projection lithography (EPL) for NGL is discussed in U.S. Pat. Nos. 4,554,458; 5,866,913; 6,069,684; 6,296,976; and 6,355,383, the disclosures of which are incorporated herein by reference. As in a conventional lithographic process, EPL involves patternwise exposure of a resist layer to imaging radiation by projecting the imaging radiation through a patterned mask. In the case of EPL, the electron projection radiation is the imaging radiation. The exposure (optionally followed by baking) induces a chemical reaction in the exposed portions of the resist which changes the solubility of the exposed regions of the resist. Thereafter, an appropriate developer, usually an aqueous base solution, is used to selectively remove the resist either in the exposed regions (positive-tone resists) or, in the unexposed region (negative-tone resists). The pattern thus defined is then imprinted on the wafer by etching away the regions that are not protected by the resist with a dry or wet etch process.

Unfortunately, EPL provides a low intensity imaging radiation such that high throughput needed for commercial semiconductor manufacture cannot be achieved with the resist materials currently available. EUV lithography and soft x-ray lithography have similar problems due to the lack of intensity of the imaging radiation. Typically, the conventional resist materials lack sufficient sensitivity, exposure dose latitude, stability (e.g., shelf-life, resistance to phase separation, stability upon vacuum exposure, etc.). Thus, there is a need for new resist compositions that can be used for EPL, EUV, soft x-ray, and other low energy intensity lithographic imaging applications.

SUMMARY OF THE INVENTION

The invention provides improved resist compositions and lithographic methods using the resist compositions of the invention. The resist compositions of the invention are acid-catalyzed resists which are characterized by the presence of a radiation sensitive acid generator component comprising:
(i) a first radiation sensitive acid generator selected from the group consisting of dissolution-inhibiting acid generators, and
(ii) a second radiation sensitive acid generator selected from the group consisting of unprotected acidic group-functionalized acid generators and acid labile group-protected acidic group-functionalized radiation sensitive acid generators.

The combination of acid generators generally enables formation of high sensitivity resists suitable for use in EPL, EUV, soft x-ray, and other low energy intensity lithographic imaging applications. The resist compositions may be useful in other lithographic processes as well.

In one aspect, the invention encompasses a resist composition, the composition comprising:
(a) an imaging polymer, and
(b) a radiation sensitive acid generator component, the radiation sensitive acid generator component comprising:
(i) a first radiation sensitive acid generator selected from the group consisting of dissolution-inhibiting acid generators, and
(ii) a second radiation sensitive acid generator selected from the group consisting of unprotected acidic group-functionalized generators and acid labile group-protected acidic group-functionalized acid generators.

The imaging polymer preferably comprises a ketal-functionalized acid sensitive polymer. The second acid generator preferably comprises an acidic moiety selected from the group consisting of phenolic, carboxylic and fluoroalcohol acidic moieties. The resist composition preferably contains at least about 4 wt. % of the radiation sensitive acid generator component based on the weight of the imaging polymer.

In another aspect, the invention encompasses a method of forming a patterned material structure on a substrate using the resist composition of the invention, the method comprising:
(A) providing a substrate with a layer of the material,
(B) applying a resist composition of the invention to the substrate to form a resist layer on the substrate;
(C) patternwise exposing the substrate to radiation whereby acid is generated by the acid generator of the resist in exposed regions of the resist layer by the radiation,
(D) contacting the substrate with an aqueous alkaline developer solution, whereby the exposed regions of the resist layer are selectively dissolved by the developer solution to reveal a patterned resist structure, and (E) transferring resist structure pattern to the material layer by etching into the material layer through spaces in the resist structure pattern.

The imaging radiation is preferably electron projection, EUV or soft x-ray radiation. The material to be patterned is preferably selected from the group consisting of organic dielectrics, semiconductors, ceramics and metals.

These and other aspects of the invention are discussed in further detail below.

DETAILED DESCRIPTION OF THE INVENTION

The invention provides improved resist compositions and lithographic methods using the resist compositions of the invention. The resist compositions of the invention are acid-catalyzed resists which are characterized by the presence of a radiation sensitive acid generator component comprising:
(i) a first radiation sensitive acid generator selected from the group consisting of dissolution-inhibiting acid generators, and
(ii) a second radiation sensitive acid generator selected from the group consisting of unprotected acidic group-functionalized acid generators and acid labile group-protected acidic group-functionalized acid generators.

The combination of acid generators generally enables formation of high sensitivity resists suitable for use in EPL, EUV, soft x-ray, and other low energy intensity lithographic imaging applications. The resist compositions may be useful in other lithographic processes as well. The invention also encompasses methods of using these resists to pattern materials.

The resist compositions of the invention generally comprise:
(a) an acid-sensitive imaging polymer, and
(b) a radiation sensitive acid generator component comprising:
(i) a first radiation sensitive acid generator selected from the group consisting of dissolution-inhibiting acid generators, and
(ii) a second radiation sensitive acid generator selected from the group consisting of unprotected acidic group-functionalized acid generators and acid labile group-protected acidic group-functionalized acid generators.

The invention is not limited to any specific acid-sensitive imaging polymer. The acid-sensitive imaging polymer is preferably a polymer having (a) pendant acid labile protecting groups which inhibit solubility of the resist in aqueous alkaline solutions, and (b) pendant polar groups (e.g., hydroxyl, carboxyl, fluoroalcohol, etc.) which promote the solubility of the resist composition in aqueous alkaline solutions. Preferred acid-labile protecting groups comprise an acid labile moiety selected from the group consisting of tertiary alkyl (or cycloalkyl) carboxyl esters (e.g., t-butyl, methyl cyclopentyl, methyl cyclohexyl, methyl adamantyl), ketals, and acetals. More preferably, the acid labile moiety is a ketal, most preferably a cyclic aliphatic ketal such as methoxycyclopropanyl, ethoxycyclopropanyl, butoxycyclohexanyl, methoxycyclobutanyl, ethoxycyclobutanyl, methoxycyclopentanyl, ethoxycyclopentanyl, methoxycyclohexanyl, ethoxycyclohexanyl, propoxycyclohexanyl, methoxycycloheptanyl, methoxycyclooctanyl or methoxyadamantyl. Preferred imaging polymers are those described in U.S. Pat. Nos. 6,037097 and 6,043,003, the disclosures of which are incorporated herein by reference.

The radiation acid generator component comprises a combination of radiation sensitive acid generators. The first radiation sensitive acid generator is selected from the group consisting of dissolution-inhibiting acid generators. These acid generators are dissolution-inhibiting in the absence of the imaging radiation needed to cause acid formation. Dissolution-inhibiting acid generators are generally characterized by the absence of (a) acidic functional groups, and (b) acid labile group-protected acidic functional groups. Examples of suitable radiation-sensitive dissolution-inhibiting acid generators include the versions of the following acid generators which do not have (a) acidic functional groups, and (b) acid labile group-protected acidic functional groups: onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), sulfonate esters of hydroxyimides, N-sulfonyloxynaphthalimides (N-camphorsulfonyloxynaphthalimide, N-pentafluorobenzenesulfonyloxynaphthalimide), a-a' bis-sulfonyl diazomethanes, naphthoquinone-4-diazides, alkyl disulfones and others. A preferred dissolution inhibiting acid generator is triphenyl sulfonium triflate. The invention is not limited to any specific dissolution-inhibiting acid generator.

The second radiation sensitive acid generator is selected from the group consisting of unprotected acidic group-functionalized acid generators and acid labile group-protected acidic group-functionalized acid generators. The second acid generator, in its unprotected state, promotes solubility of the resist in aqueous alkaline solutions. The acidic group-functionalized acid generators preferably have an acidic functional group having a pKa of about 13 or less, more preferably about 10 or less. The acidic functional group is preferably selected from the group consisting of phenolic moieties, carboxylic moieties and fluoroalcohol moieties. The acid labile group-protected acidic group-functionalized acid generators provide an acidic functionality (preferably selected from the group consisting of phenolic moieties, carboxylic moieties and fluoroalcohol moieties) upon reaction with an acid. Examples of acid labile group-protected acidic group-functionalized acid generators are disclosed in U.S. Pat. Nos. 5,374,504 and 5,191,124, the disclosures of which are incorporated herein by reference. A preferred second acid generator is dimethyl (3,5-dimethyl)-4-hydroxyphenyl sulfonium perfluorobutane sulfonate, the structure of which is shown below:

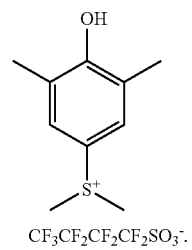

$CF_3CF_2CF_2CF_2SO_3^-$.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate (PGMEA) and cyclohexanone.

The compositions of the invention may further contain minor amounts of auxiliary components such as dyes/sensitizers, base additives, etc. as are known in the art. Preferred base additives are bases which scavenge trace acids while not having an excessive impact on the performance of the resist. Preferred base additives are tertiary alkyl amines, aromatic amines, or tetraalkyl ammonium hydroxides such as t-butyl ammonium hydroxide (TBAH). Preferably, the unexposed resist compositions of the invention are substantially insoluble in aqueous alkaline solutions commonly used to develop lithographic images.

The resist compositions of the invention preferably contain about 0.5-20 wt. % (based on total weight of imaging polymer in the composition) of the acid generator component more preferably about 4-20 wt. %, most preferably about 7-20 wt. %. The weight ratio of first to second acid generators is preferably about 5:1 to 1:5, more preferably about 3:1 to 1:3, most preferably about 2:1 to 1:2. The acid generator component preferably results in a resist composition having an imaging energy dose requirement for high KeV (e.g., about 50-200 KeV) electron sources of less than about 15 $\mu C/cm^2$, more preferably less than about 10 $\mu C/cm^2$, most preferably less than about 5 $\mu C/cm^2$. For low KeV (e.g., about 500 eV-10 KeV) electron sources, the resist preferably has an imaging energy dose requirement of less than about less than about 2 $\mu C/cm^2$, more preferably less than about 1 $\mu C/cm^2$. For radiation sources such as EUV, the resist compositions of the invention preferably have an imaging energy dose requirement of less than about 5 $mJ/cm^2$, more preferably less than about 2 $mJ/cm^2$, more preferably less than about 1 $mJ/cm^2$. Where a solvent is present, the overall composition preferably contains about 50-90 wt. % solvent. The composition preferably contains about 1 wt. % or less of said base additive based on the total weight of polymeric component.

The resist compositions of the invention can be prepared by combining the polymeric component, acid generator and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using electron beam projection radiation or other low energy intensity sources (e.g., EUV, soft x-ray, etc.). Where use of other imaging radiation (e.g. mid-UV, 248 nm deep UV, 193 nm UV, or x-ray) is desired, the compositions of the invention can be adjusted (if necessary) by the addition of an appropriate dye or sensitizer to the composition, reduction in amount of acid generator component, and/or by elimination of moieties which may impact the optical density at certain radiation wavelengths.

The invention encompasses a method of creating a patterned material structure on a substrate using the resist composition of the invention, the method comprising:

(A) providing a substrate with a layer of the material,
(B) applying a resist composition of the invention to the substrate to form a resist layer on the substrate;
(C) patternwise exposing the substrate to radiation whereby acid is generated by the acid generator of the resist in exposed regions of the resist layer by the radiation,
(D) contacting the substrate with an aqueous alkaline developer solution, whereby the exposed regions of the resist layer are selectively dissolved by the developer solution to reveal a patterned resist structure, and
(E) transferring resist structure pattern to the material layer by etching into the material layer through spaces in the resist structure pattern.

The material layer of the substrate is preferably selected from the group consisting of organic dielectrics, metals, ceramics, semiconductors or other material depending on the stage of the manufacture process and the desired material set for the end product. The material to be patterned may be applied using any suitable technique. The substrate is preferably a semiconductor wafer or a glass (e.g., fused quartz) plate.

If desired, an antireflective coating (ARC) may be applied over the material layer before application of the resist layer. The ARC layer may be any conventional ARC which is compatible with acid catalyzed resists, the underlying material layer, subsequent processing, etc.

Typically, the solvent-containing resist composition may then be applied to the desired substrate using spin coating or other technique. The substrate with the resist coating is then preferably heated (pre-exposure baked) to remove the solvent and improve the coherence of the resist layer. The thickness of the applied layer is preferably as thin as possible provided that (a) the thickness is preferably substantially uniform, and (b) the resist layer is sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired imaging radiation. Preferably, the imaging radiation is a low intensity energy source such as electron projection radiation, EUV or soft x-ray. The total exposure energy dose (a) for high KeV (e.g., about 50-200 KeV) electron sources is preferably less than about 15 $\mu C/cm^2$, more preferably less than about 10 $\mu C/cm^2$, most preferably less than about 5 $\mu C/cm^2$; (b) for low KeV (e.g., about 500 eV-10 KeV) electron sources, the energy dose is preferably less than about less than about 2 $\mu C/cm^2$, more preferably less than about 1 $\mu C/cm^2$; for EUV, the imaging energy dose is preferably less than about 5 $mJ/cm^2$, more preferably less than about 2 $mJ/cm^2$, more preferably less than about 1 $mJ/cm^2$.

After the desired patternwise exposure, the resist layer is typically baked to further complete the acid-catalyzed reaction and to enhance the contrast of the exposed pattern. The post-exposure bake is preferably conducted at about 60-175° C., more preferably about 90°-160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent.

The pattern from the resist structure may then be transferred to the material (e.g., organic dielectric, ceramic, metal, semiconductor, etc.) of the underlying substrate. Typically, the transfer is achieved by reactive ion etching or some other etching technique. Any suitable etching technique may be used. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; 5,821,469, and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Synthesis of dimethyl (3,5-dimethyl)-4-hydroxyphenyl sulfonium perfluorobutane sulfonate (DMPHS PFBUS)

8 ml of Eaton's Reagent (from Aldrich, 7.7 wt. % of $P_2O_5$ in methanesulfonic acid) through an addition funnel to a mixture of 2.44 g (0.02 mol) of 2,6-dimethylphenol and 1.56 g (0.02 mol) of dimethylsulfoxide in a 50-mL 3-necked round bottom flask equipped with a thermometer, $N_2$ inlet and magnetic stirrer. The rate of the addition was adjusted so that the temperature of the mixture did not rise above 60° C. during addition. After the exotherm had subsided, the reaction mixture was stirred at room temperature for 2 hours and then poured into 40 mL of distilled water. The solution was neutralized to pH=7 by adding ammonium hydroxide solution. The resulting solution was stirred at room temperature for half an hour and then filtered through a filter paper to remove the brown oily side products. The filtrate was added dropwise to a solution of 6.76 g (0.02 mol) of potassium perfluorobutanesulfonate (KPFBuS) in 70 mL water while stirring. The mixture was further stirred overnight. The white precipitate was collected by suction filtration and washed with water and ether three times. The crude product was redissolved in 15-20 mL of ethyl acetate. To this solution, 200-300 mg of aluminum oxide (activated, basic) was added. The mixture was rolled on a roller overnight and then filtered through Celite. The filtrate was precipitated into 100 mL ether while stirring. The white precipitate was collected and further washed with ether three times. Final yield: 2.2 g (23%).

EXAMPLE 2

Synthesis of dimethyl phenyl sulfonium perfluorobutane sulfonate (DMPS PFBUS)

A solution of 4.07 g (0.01 mol) of silver perfluorobutane sulfonate in 30 ml of nitromethane was added dropwise, at room temperature, to a mixture containing 1.24 g (0.01 mol) of thioanisole and 4.26 g (0.03 mol) of methyl iodide in 25 ml of nitromethane. The resulting mixture was stirred at room temperature for 15 hours. The reaction mixture was filtered through Celite to remove the white precipitate. The filtrate was concentrated to about 10 ml and then precipitated into 120 ml of diethyl ether. The white solid was collected by vacuum filtration. The crude product was redissolved in 15-20 mL of ethyl acetate. To this solution, 200-300 mg of aluminum oxide (activated, basic) was added. The mixture was rolled on a roller overnight and then filtered through Celite. The filtrate was precipitated into 100 mL ether while stirring. The white precipitate was collected and further washed with ether three times. Final yield: 3.64 g (83%). The product was identified as dimethyl phenyl sulfonium perfluorobutane sulfonate by NMR spectroscopy.

EXAMPLE 3

Synthesis of methoxycyclohexene (MOCH) protected polyvinylphenol (mondisperse polymer)(PHMOCH)

150 g of propylene glycol methyl ether acetate (PGMEA) was added to 50 g of polyvinylphenol (VP5000 from Tomen) with stirring until a clear solution is obtained. The solution was then combined with approximately 35 mg of oxalic acid. After the acid was dissolved, 18.5 g of 1-methoxycyclohexene was added to the solution, and the reaction was carried out at room temperature with stirring overnight. The reaction was then quenched with 6 g of basic active aluminum oxide. The protection level of 25% on phenol group was determined by $C^{13}$ NMR.

EXAMPLE 4 (COMPARISON)

Resist with Single Dissolution Inhibiting Acid Generator (TPS TRF)

Resist formulations were obtained by mixing the partially protected polymer, PHMOCH from Example 3, with 0.14 wt. % (relative to the polymer) tetrabutyl ammonium hydroxide (TBAH), 0.7 wt. % triphenylsulfonium triflate (TPS TRF) and 200-400 ppm of FC-430 surfactant (3M Company) in PGMEA solvent. The total solid weight content in the solution was about 12%. Similar formulations were made with the loadings of TPS TRF shown in the table below. The resists were spin coated onto respective HMDS-primed wafers. The coated wafers were baked on a hot plate at 110° C. for 1 minute. The resist was then exposed on IBM-built high throughput e-beam projection system at 75 kV. After exposure, the resists were baked at 110° C. for 1 minute before being developed with 0.263 N TMAH for 60s. The following table lists the doses to resolve 100 nm line/space images with different TPS TRF loadings.

| TPS TRF loading | Dose to resolve 100 nm l/s | Image profile |
|---|---|---|
| 0.7 wt. % | 40 µC/cm² | Straight |
| 1.4 wt. % | 24 µC/cm² | Straight |
| 3 wt. % | 12 µC/cm² | Straight |
| 5 wt. % | 9 µC/cm² | Slight foot |
| 6 wt. % | 7 µC/cm² | Undercut profile |
| 7 wt. % | 5 µC/cm² | Phase segregation on the coated film |

EXAMPLE 5 (COMPARISON)

Resist with Single Dissolution Promoting Acid Generator

Resist formulations were obtained in the manner of Example 4 except that DMPHS PFBUS of Example 1 was substituted for TPS TRF. The loading of DMPHS PFBUS is indicated in the table below based on the weight of the imaging polymer. The resists were spin coated onto respective HMDS-primed wafers. The wafers were baked on a hot plate at 110° C. for 1 minute. The resist-coated wafers were exposed at 25 kV on ElectronCure™-200M flood exposure tool manufactured by Electron Vision Group. After exposure, resists were baked at 110° C. for 1 minute before being developed with 0.263 N TMAH for 60s. The following table lists the doses to clear large square exposed with different DMPHS PFBUS loadings.

| DMPHS PFBUS loading | $E_0$, dose to clear |
| --- | --- |
| 0.82 wt. % | 12 µC/cm² |
| 3.28 wt. % | 4 µC/cm² |
| 4.91 wt. % | 3 µC/cm² |
| 6.55 wt. % | 2.5 µC/cm² |
| 8.19 wt. % | 2.1 µC/cm² |
| 12.28 wt. % | 1.5 µC/cm² (start to see extra thinning) |

EXAMPLE 6

Resist with Mixed Acid Generators (DMPS PFBUS and DMPHS PFBUS) According to the Invention Resist formulations were obtained in the manner of Example 4 except that a combination of DMPHS PFBUS of Example 1 and DMPS from Example 2 was substituted for TPS TRF. The loading of the acid generators is indicated in the table below based on the weight of the imaging polymer.

The resists were spin coated onto respective HMDS-primed wafers. The resist-coated wafers were baked on a hot plate at 110° C. for 1 minute. The resist-coated wafers were exposed using an IBM-built 25 kV Gaussian-beam system (FELS). After exposure, resists were baked at 110° C. for 1 minute before being developed with 0.263 N TMAH for 60s. The following table lists the doses to resolve 150 nm l/s images with different DMPS PFBUS and DMPHS PFBUS loadings and image profiles.

| Sample | DMPS PFBUS loading | DMPHS PFBUS loading | Dose to resolve 100 nm l/s | Image profile |
| --- | --- | --- | --- | --- |
| 2x DMPS (1/0) (comparison) | 1.49 wt. % | 0 wt. % | 4.5 µC/cm² | undercut |
| Mix a (3/1) | 0.56 wt. % | 0.82 wt. % | 5 µC/cm² | square and straight |
| Mix b (1/1) | 0.74 wt. % | 1.64 wt. % | 5 µC/cm² | square and straight |
| Mix c (1/3) | 0.37 wt. % | 2.45 wt. % | 5 µC/cm² | square and straight |
| 4x DMPHS (0/1) (comparison) | 0 wt. % | 3.27 wt. % | 5 µC/cm² | slightly rounding on top |

EXAMPLE 7

Resist with Mixed Acid Generators (TPS TRF and DMPHS PFBUS) According to the Invention Resist formulations were obtained in the manner of Example 4 except that a combination of DMPHS PFBUS of Example 1 and TPS TRF was substituted for TPS TRF. The loading of the acid generators is indicated in the table below based on the weight of the imaging polymer. The resists were spin coated onto respective HMDS-primed wafers. The resist-coated wafers were baked on a hot plate at 110° C. for 1 minute. The resist-coated wafers were exposed using an IBM-built 25 kV Gaussian-beam system (FELS). After exposure, resists were baked at 110° C. for 1 minute before being developed with 0.263 N TMAH for 60s. The following table lists profiles for 150 nm and 200 nm l/s images with different TPS TRF and DMPHS PFBUS loadings at both 1.5 µC/cm² and 2.0 µC/cm².

| Sample | TPS TRF loading | DMPHS PFBUS loading | Image profile at 1.5 µC/cm² | Image profile at 2.0 µC/cm² |
| --- | --- | --- | --- | --- |
| 8x TPS TRF (1/0) (comparison) | 5.6 wt. % | 0 wt. % | undercut | undercut |
| Mix d (3/1) | 4.2 wt. % | 3.28 wt. % | slightly undercut | slightly undercut |
| Mix e (1/1) | 2.8 wt. % | 6.55 wt. % | square and straight | square and straight |
| Mix f (1/3) | 1.4 wt. % | 9.83 wt. % | square and straight | slightly rounding and straight |
| 16x DMPHS PFBUS (0/1) (comparison) | 0 wt. % | 13.10 wt. % | severe rounding and film loss | severe rounding and film loss |

EXAMPLE 8

Optimized Formulation

A study of resist performance characteristics (e.g., dose latitude, resist profile as related to unexposed dissolution, sensitivity, and $E_0/E_{CD}$) was performed to determine an optimal composition using the imaging polymer of Example 3 and the combination of acid generators of Example 7. From this study, it appears that a composition having 0.28 wt. % TBAH, 7 wt. % TPS TRF and 7.37 wt. % DMPHS PFBUS provided the best overall performance (31% dose latitude, 7.4 Å/second unexposed dissolution rate, an $E_0/E_{size}$ of 0.74, and a sensitivity of 3.9 mC/cm² with vertical resist profiles).

Wafers coated with this formulation in the manner of Example 4 were then imaged on a soft x-ray (1.1 nm wavelength) lithography tool from JMAR Technologies Inc. Using soft x-ray, the resist of the invention required a dose of less than 15 mJ/cm². Commercial resists would have an exposure dose requirement in the range of 50-90 mJ/cm² for the same soft x-ray exposure process.

What is claimed is:

1. A resist composition comprising (a) an imaging polymer, and (b) a radiation sensitive acid generator component, said radiation sensitive acid generator component comprising:
    (i) a first radiation sensitive acid generator selected from the group consisting of dissolution-inhibiting acid generators, and
    (ii) a second radiation sensitive acid generator selected from the group consisting of unprotected acidic group-functionalized radiation sensitive acid generators.

2. The resist composition of claim 1 wherein said imaging polymer comprises a ketal-functionalized acid sensitive polymer.

3. The resist composition of claim 1 wherein said second radiation-sensitive acid generator is an acidic group-functionalized acid generator comprising an acidic moiety selected from the group consisting of phenolic moieties, carboxylic moieties and fluoroalcohol moieties.

4. The composition of claim 1 wherein said resist composition contains at least about 4 wt. % of said radiation sensitive acid generator component based on the weight of said imaging polymer.

5. The composition of claim 1 wherein said first and second acid generators are present in a mole ratio of about 5:1 to about 1:5.

6. A method of forming a patterned material structure on a substrate, said material being selected from the group consisting of organic dielectrics, semiconductors, ceramics and metals, said method comprising:
 (A) providing a substrate with a layer of said material,
 (B) applying a resist composition to said substrate to form a resist layer on said substrate, said resist composition comprising an imaging polymer and a radiation sensitive acid generator component, said radiation sensitive acid generator component comprising:
  (i) a first radiation sensitive acid generator selected from the group consisting of dissolution-inhibiting acid generators, and
  (ii) a second radiation sensitive acid generator selected from the group consisting of unprotected acidic group-functionalized radiation sensitive acid generators,
 (C) patternwise exposing said substrate to radiation whereby acid is generated by acid generator of the resist in exposed regions of said resist layer by said radiation,
 (D) contacting said substrate with an aqueous alkaline developer solution, whereby said exposed regions of said resist layer are selectively dissolved by said developer solution to reveal a patterned resist structure, and
 (E) transferring resist structure pattern to said material layer, by etching into said material layer through spaces in said resist structure pattern.

7. The method of claim 6 wherein at least one intermediate layer is provided between said material layer and said resist layer, and step (E) comprises etching through said intermediate layer.

8. The method of claim 6 wherein said radiation is selected from the group consisting of electron projection radiation, EUV radiation, and soft x-ray radiation.

9. The method of claim 6 wherein said substrate is baked between steps (C) and (D).

10. The method of claim 6 wherein said imaging polymer comprises a ketal-functionalized acid sensitive polymer.

11. The method of claim 6 wherein said second radiation-sensitive acid generator is an acidic group-functionalized acid generator comprising an acidic moiety selected from the group consisting of phenolic moieties, carboxylic moieties and fluoroalcohol moieties.

12. The method of claim 6 wherein said resist composition contains at least about 4 wt. % of said radiation sensitive acid generator component based on the weight of said imaging polymer.

13. The method of claim 6 wherein said first and second acid generators are present in a mole ratio of about 5:1 to about 1:5.

14. The composition of claim 1 wherein said second radiation-sensitive acid generator is dimethyl (3,5-dimethyl)-4-hydroxyphenyl sulfonium perfluorobutane sulfonate.

* * * * *